Nov. 3, 1964 D. G. VICE ETAL 3,155,914

COAXIAL REACTIVE TUNING STUB FOR TUNING A LOWER FREQUENCY SIGNAL WITHOUT AFFECTING A HIGHER FREQUENCY SIGNAL

Filed April 29, 1963

INVENTORS
DAVID G. VICE
JOHN MOWLE &
DAVID JARDINE

BY- Smart & Biggar
ATTORNEYS.

United States Patent Office 3,155,914

Patented Nov. 3, 1964

3,155,914

COAXIAL REACTIVE TUNING STUB FOR TUNING A LOWER FREQUENCY SIGNAL WITHOUT AFFECTING A HIGHER FREQUENCY SIGNAL

David George Vice, John E. Mowle, and David G. Jardine, Ottawa, Ontario, Canada, assignors to Northern Electric Company Limited, Montreal, Quebec, Canada Filed Apr. 29, 1963, Ser. No. 276,650

5 Claims. (Cl. 330—4.9)

This invention relates to a coaxial reactive tuning stub which may be used to tune a non-degenerate parametric amplifier.

In the microwave region, signals widely separated in frequency are often mixed or combined in a common circuit such as may be found in a mixer or a parametric amplifier. A coaxial reactive tuning stub is often used to tune the circuit at one of the signal frequencies. The reactance of the stub is varied by changing the electrical length of the stub at the desired frequency. This is generally accomplished by varying the position of a mechanical short-circuit placed across one end of the stub. A disadvantage of such a stub is that varying the position of the short circuit not only affects its reactance at the desired frequency but also at all the other signal frequencies present in the circuit.

This disadvantage is overcome by the present invention by providing a coaxial reactive tuning stub having an electrical length equal to a whole number of quarter wavelengths at the higher frequency and not equal to a whole number of quarter wavelengths at the lower frequency. The reactance of the stub is varied at the lower frequency by changing the stub's characteristic impedance. Because the electrical length of the stub is a whole number of quarter wavelengths long, the reactance of the stub at the higher frequency remains virtually open or short circuited when the characteristic impedance is changed.

The reactance of the circuit at the higher frequency is independently varied by coupling the higher frequency to the circuit through waveguide components. The size of the waveguide is so chosen that the lower frequency is below the cut-off wavelength of the waveguide and the lower frequency will, therefore, not propagate in it. Standard tuning elements such as screws and irises are employed in the waveguide for tuning the circuit at the higher frequency. Since the lower frequency does not propagate in the waveguide and the higher frequency does not propagate in the stub, no interaction between the two tuning elements at the two signal frequencies can exist. The invention is further described with reference to the accompanying drawings in which:

In a non-degenerate parametric amplifier, the following three frequencies are of primary importance. The signal frequency $f_s$ is the input radio frequency that is to be amplified by the parametric amplifier. The pump is a source of power of high radio frequency, $f_p$, generally greater than twice the frequency of the signal, that is used to drive a varactor diode and generate increased amplification of the signal frequency fed to it. The idler frequency $f_i=f_p-f_s$ is the difference between the pump frequency and the signal frequency. It is often referred to as the lower sideband. A fourth frequency $f_u=f_p+f_s$ known as the upper sideband is also present but is generally suppressed in the tuned circuits of the amplifier.

Figure 1:
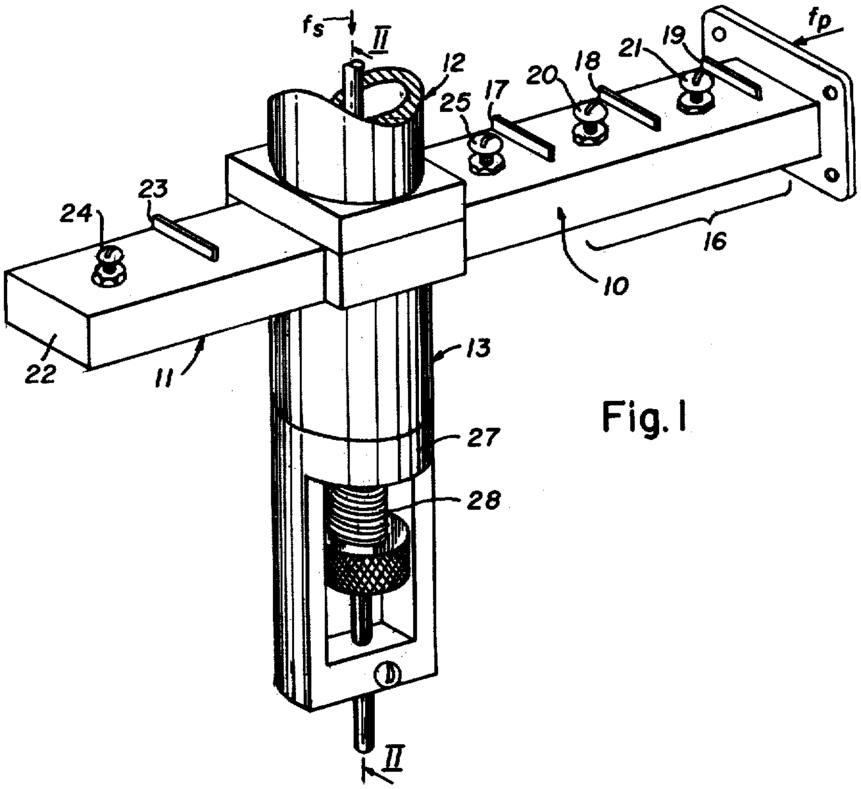
FIGURE 1 is a perspective view of a one-port parametric amplifier.
Figure 2:
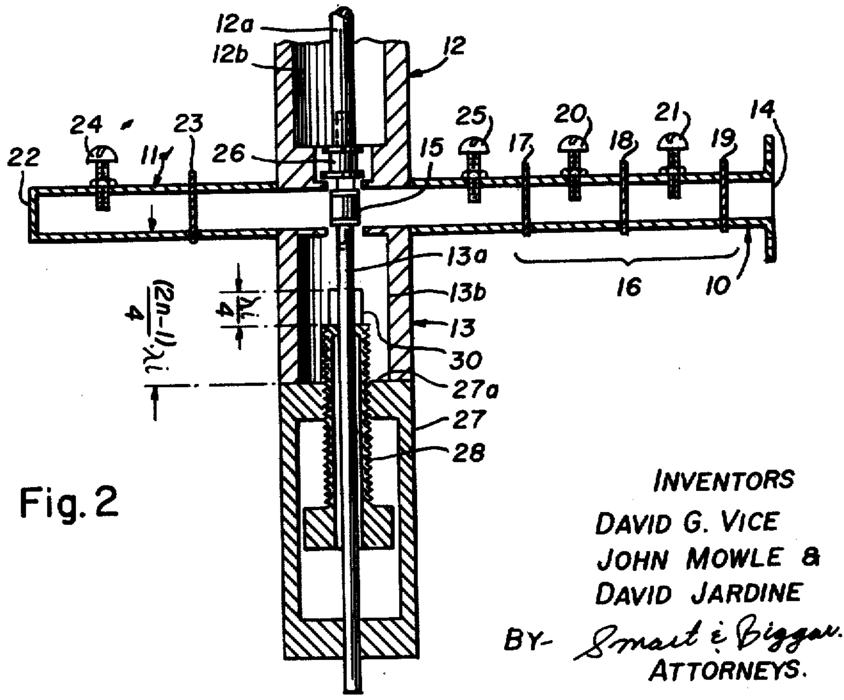
FIGURE 2 is a vertical cross section of the amplifier taken on the line II—II of FIGURE 1, and illustrating details of the coaxial reactive tuning stub and the waveguide tuning elements.

Referring now to FIGURES 1 and 2, the amplifier comprises a rectangular waveguide pump arm 10, an idler arm 11, a coaxial signal input line 12 having an inner conductor 12a and an outer conductor 12b, and a coaxial signal tuning stub 13 having an inner conductor 13a and an outer conductor 13b. The pump arm 10 and the idler arm 11 are constructed of rectangular waveguide components in which the dominant ($TE_{10}$) mode is employed. The coaxial signal input line 12 and the coaxial signal tuning stub 13 also use the dominant (TEM) mode.

The pump arm 10 has an input port 14 for connecting a source (not shown) of pump power of frequency $f_p$. The pump power is connected from the input port 14 to a varactor diode 15 located in the idler arm 11, through a two-section, iris-coupled waveguide filter 16 having three inductive coupling irises 17, 18 and 19, and two frequency tuning screws 20 and 21. The filter 16 has a relatively narrow pass band and is tuned to pass only the pump frequency $f_p$ and reflect both the idler frequency $f_i$ and upper sideband frequency $f_u$. The idler arm 11 extends from the inductive coupling iris 17 of the waveguide filter 16 to an end plate 22 and includes an inductive coupling iris 23 and frequency tuning screws 24 and 25. The iris 23 in conjunction with the end plate 22 and the tuning screw 24 forms an idler tuning circuit in the waveguide idler arm 11.

The varactor diode 15 is symmetrically placed across the narrow dimension of the rectangular waveguide idler arm 11, parallel to the electric field of the guide. The signal frequency $f_s$ is coupled to one end of the varactor diode 15 from the center conductor 12a of the signal input line 12 by a low pass filter 26. The purpose of the filter 26 is to eliminate the pump and idler frequencies from the signal input line 12. The other end of the varactor diode 15 is connected to the inner conductor 13a of the coaxial signal tuning stub 13. The outer conductor 13b of the signal tuning stub 13 is connected at one end to the broad dimension of the waveguide idler arm 11, and at the other end to an inner conductor support 27. The face of the inner conductor support 27 which is in contact with the end of the outer conductor of the signal tuning stub 13, forms a shorting plane 27a for the signal tuning stub 13. An adjustable sleeve 28 makes contact with the inner conductor of the tuning stub 13 and the inner conductor support 27; the combination thus forming a variable short circuited tuning stub. The electrical length of the signal tuning stub from the inner surface of the waveguide idler arm 11 to the shorting plane 27a of the inner conductor support 27 is made equal to $$\frac{(2_n-1)}{4}\lambda_i$$

and is less than $$\frac{\lambda_s}{4}$$

where:

$n$ is a positive integer, $\lambda_i$ is the wave length at the idler frequency, and $\lambda_s$ is the wave length at the signal frequency.

The end of the adjustable sleeve 28 is a stepped impedance transformer 29 with an electrical length of $$\frac{\lambda_i}{4}$$

The steps produce fringing discontinuities which by design, are equal and opposite in value and therefore, cancel each other at the idler frequency $f_i$.

Because the electrical length of the tuning stub 13 at the idler frequency $f_i$ is by design an odd number wave lengths long, the reflected reactance is independent of the characteristic impedance of the stub 13, and it will therefore, always present a substantially open circuit to the varactor diode 15. However, by changing the insertion length of the adjustable sleeve 28, the characteristic impedance of the tuning stub 13 is altered, thus varying the reactance across the diode 15 at the signal frequency $f_s$.

This may be better understood by analysing the relationship between the characteristic impedance, line length, and reactance for a simple short circuited stub which is given by the formula:

$$X_L = jZ \tan \frac{2\pi d}{\lambda}$$

where the characteristic impedance is given by the formula:

$$Z = 138 \log \frac{b}{a}$$

where:

$X_L$ is the inductive reactance of the stub,
Z is the characteristic impedance of the stub,
$\lambda$ is the wave length of the frequency under consideration,
$d$ is the electrical length of the stub,
$b$ is the inner diameter of the outer conductor and
$a$ is the outer diameter of the inner conductor or the sleeve.

From the above, it can be seen that the reactance of the stub 13 can be altered by varying its characteristic impedance except at the open and short circuit points where the reactance will be infinity or zero. Thus, if the adjustable sleeve 28 is fully withdrawn from the signal tuning stub 13 until the front face of the sleeve 28 is flush with the sorting plane 27*a* of the inner conductor support 27, the reactance presented to the varactor diode 15 at the signal frequency $f_s$ will be that of a short circuited coaxial stub with a fixed electrical length having its characteristic impedance determined by the diameters of the outer and inner conductors of the stub 13. If the adjustable sleeve 28 is fully inserted into the stud, the reactance now presented to the diode 15 at the signal frequency $f_s$ will be that of a short circuited coaxial stub with the same electrical length but having a characteristic impedance determined by the inner diameter of the outer conductor of the stub 13 and the diameter of the adjustable sleeve 28. Adjusting the insertion length of the adjustable sleeve 28 provides a continuously variable reactance at the signal frequency $f_s$ between these two values.

In both the above examples, the reactance of the stub 13 at the idler frequency $f_i$ was extremely high since by design the overall length of the short circuited stub 13 has been made an odd number of quarter wavelengths long.

When the adjustable sleeve is set to an intermediate setting, the normalized input impedance of the signal tuning stub 13 is as follows:

$$Z_{in} = \frac{\frac{jZ_1}{Z_2} \tan Bd_1 + j \tan Bd_2}{1 - \frac{Z_1}{Z_2} \tan Bd_1 \tan Bd_2}$$

where:

$Z_{in}$ is the normalized input impedance of the signal tuning stub 13.
$Z_1$ is the characteristic impedance of the section of the stub 13 determined by the inner diameter of the outer conductor 13*b* and the diameter of the sleeve 28.
$Z_2$ is the characteristic impedance of the section of the stub 13 determined by the inner diameter of the outer conductor 13*b* and the outer diameter of the inner conductor 13*a*.
$d_1$ is the electrical length of the section of the stub 13 having the characteristic impedance $Z_1$.
$d_2$ is the electrical length of the section of the stub 13 having the characteristic impedance $Z_2$.
B is equal to $2\pi/\lambda$ where $\lambda$ is the wavelength of the frequency under consideration.

From the above formula, it can be shown that while the reactance of the stub 13 will vary at the signal frequency $f_s$ when an intermediate setting of the sleeve 28 is employed, it remains virtually open circuited to the varactor diode 15 at the idler frequency $f_i$.

The idler arm 11 is tuned by varying the insertion depth of the frequency tuning screws 24 and 25. The signal frequency $f_s$ is below the cut-off wavelength of the wave guide and will, therefore, not propagate in the guide. Thus, varying the insertion depth of the frequency tuning screws 24 and 25 tunes the varactor diode 15 at the idler frequency $f_i$ but does not affect the tuning of the diode 15 at the signal frequency $f_s$, and varying the reactance of the coaxial signal tuning stub 13 tunes the varactor diode 15 at the signal frequency $f_s$ but does not affect the tuning of the diode 15 at the idler frequency $f_i$.

In the above described embodiment, the impedance of the coaxial signal tuning stub presented to the varactor diode 15 at the idler frequency $f_i$ is virtually an open circuit. It can be readily seen that if the electrical length of the stub 11 is made an even number of quarter wavelengths at the idler frequency $f_i$ rather than an odd number of quarter wavelengths, the impedance presented to the varactor diode 15 at the idler frequency $f_i$ will then be virtually a short circuit.

What I claim as my invention is:

1. A coaxial reactive tuning stub adapted to have a first and a second radio frequency signal connected thereto, the first signal having a lower frequency than the second signal; said stub having an electrical length equal to a whole number of quarter wavelengths at the second signal frequency, an electrical length differing from a whole number of quarter wavelengths at the first signal frequency, and comprising means for varying the characteristic impedance of the stub whereby the reactance of the stub at the first signal frequency is varied and the reactance of the stub at the second signal frequency remains virtually open or short circuited.

2. A coaxial reactive tuning stub as defined in claim 1 comprising an inner and an outer conductor, a shorting plane at one end of said stub, said plane having a hole therethrough, a sleeve having an inner and an outer surface, the inner surface of the sleeve being in peripheral contact with the outer surface of the inner conductor, and the outer surface of the sleeve being in peripheral contact with the periphery of the hole in said plane; and in which the sleeve is adapted to be moved axially along the inner conductor whereby the reactance of the stub at the first signal frequency is varied.

3. A parametric amplifier adapted to have a signal frequency and a pump frequency connected thereto, an idler frequency resulting therefrom; said amplifier comprising a varactor diode, a waveguide pump arm, a waveguide idler arm, a coaxial signal input line, and a coaxial reactive tuning stub; said stub having an electrical length equal to a whole number of quarter wavelengths at the idler frequency, an electrical length differing from a whole number of quarter wavelengths at the signal frequency, and comprising means for varying the characteristic impedance of the stub whereby the reactance of the stub at the signal frequency is varied and the reactance of the stub at the idler frequency remains virtually open or short circuited.

4. A parametric amplifier as defined in claim 3 in which said stub comprises an inner and an outer conductor, a shorting plane at one end of said stub, said plane having a hole therethrough, a sleeve having an inner and an outer surface, the inner surface of the sleeve in peripheral contact with the outer surface of the inner conductor, and the outer surface of the sleeve in peripheral contact with the periphery of the hole in said plane; and in which the sleeve is adapted to be moved axially along the inner conductor whereby the reactance of the stub at the signal frequency is varied.

5. A parametric amplifier as defined in claim 4 in which the electrical length of the stub is less than one-quarter wavelength at the signal frequency and the electrical length of the stub is equal to an odd number of quarter wavelengths at the idler frequency.

References Cited by the Examiner

Younger et al.: "Proceedings of the IRE," July 1959, pages 1271–1272.

Pettai et al.: "Proceedings of the IRE," July 1960, pages 1323–1324.

ROY LAKE, *Primary Examiner.*